United States Patent
Lin et al.

[19]

[11] Patent Number: 6,164,981
[45] Date of Patent: Dec. 26, 2000

[54] PACKAGE SOCKET SYSTEM

[75] Inventors: Nick Lin, Hsing-Chuang; Cheng-Hung Lin, Chung-Ho, both of Taiwan

[73] Assignee: Hon Hai Precision Ind. Co., Ltd., Taipei Hsien, Taiwan

[21] Appl. No.: 09/291,791

[22] Filed: Apr. 14, 1999

[30] Foreign Application Priority Data

Aug. 31, 1998 [TW] Taiwan .................................. 87214313

[51] Int. Cl.[7] .......................... H01R 12/04; H01R 12/16; H05K 1/00
[52] U.S. Cl. .............................. 439/70; 439/91; 174/260; 174/263; 361/767; 361/772
[58] Field of Search .................................. 439/70–73, 91; 174/260–267; 361/767–776, 704, 719; 257/718, 719

[56] References Cited

U.S. PATENT DOCUMENTS

| | | | |
|---|---|---|---|
| 4,417,777 | 11/1983 | Bamford | 439/70 |
| 5,641,297 | 6/1997 | Kozel | 439/70 X |
| 5,641,945 | 6/1997 | Abe et al. | 439/70 X |
| 5,669,774 | 9/1997 | Grabbe | 439/70 |
| 5,716,222 | 2/1998 | Murphy | 439/91 |
| 5,746,608 | 5/1998 | Taylor | 439/70 |
| 5,766,021 | 6/1998 | Pickles et al. | 439/70 |

*Primary Examiner*—Stanley J. Witkowski
*Attorney, Agent, or Firm*—Wei Te Chung

[57] ABSTRACT

A package socket system includes a positioning frame positioned on a circuit board. The positioning frame has an interior space defined between four side walls for receiving and accommodating a BGA socket that retains an array of contacts therein. The contacts have a lower ball end in contact engagement with and supported on conductive pads of the circuit board. A BGA package having an array of solder balls is received in the positioning frame and supported on the socket with the solder balls received in flared upper ends of the contacts of the socket. A heat sink has a flat base supported on the positioning frame and secured to the substrate to establish a firm contact engagement with the package thereby securely maintaining the package and the socket in position on the substrate. The positioning frame has a chamfered section and the socket and the package each have a corresponding chamfered corner for positioning purposes.

9 Claims, 5 Drawing Sheets

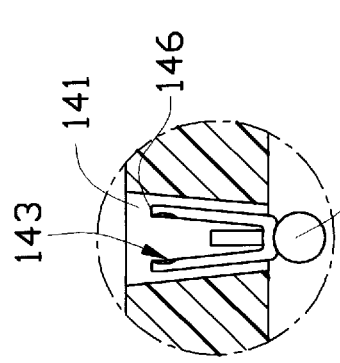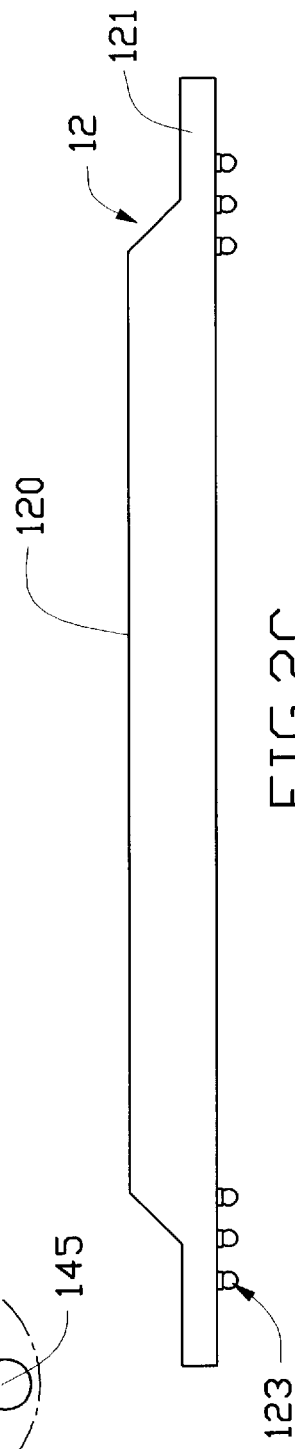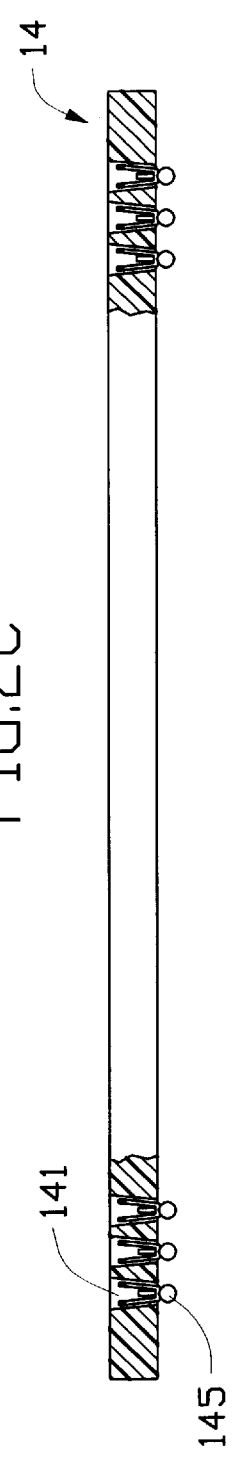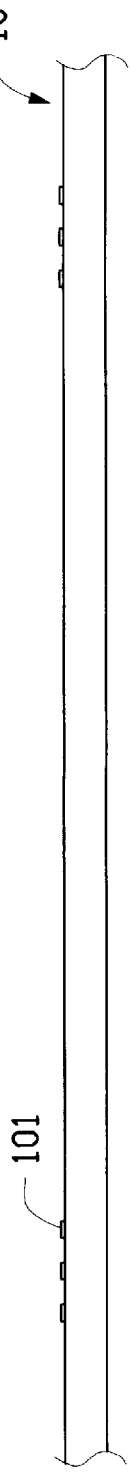

PACKAGE SOCKET SYSTEM

BACKGROUND OF THE INVENTION

1. Field of the Invention

The present invention relates to a CPU socket system, and in particular to a system for mounting a ball grid array (BGA) package to a circuit board.

2. The Prior Art

One of the most commonly used IC packages, such as a central processing unit, is a ball grid array (BGA). One way to mount a BGA package to a circuit board is by means of a BGA socket. Examples of BGA sockets are disclosed in U.S. Pat. Nos. 5,669,774 and 5,641,297. However, in the conventional BGA socket, the package and the socket may not be securely fixed and displacement caused by vibration or shock may occur. Furthermore, proper electrical engagement between the package and the socket is not easy to maintain.

U.S. Pat. No. 5,716,222 discloses a BGA socket that has positioning arms for maintaining a positional relationship with a BGA package. The BGA socket of the '222 patent also comprises a cover plate for securing the package in position. However, in the '222 device removing the package from the socket is difficult. Furthermore, the force required to secure the package to the socket is difficult to control.

It is thus desirable to have a socket system that addresses the problems encountered in the prior art.

SUMMARY OF THE INVENTION

Accordingly, an object of the present invention is to provide a package socket system comprising a positioning frame fixed on a substrate for receiving a BGA socket and a BGA package and for maintaining a precise positional relationship thereof with respect to the substrate.

Another object of the present invention is to provide a package socket system comprising a heat sink disposed on a positioning frame which is secured to a substrate for establishing a firm contact engagement with the package thereby securely maintaining the package and socket in position on the substrate while providing the package with heat dissipation capabilities.

To achieve the above objects, a package socket system in accordance with the present invention comprises a positioning frame positioned on a circuit board. The positioning frame has an interior space defined between four side walls for receiving and accommodating a BGA socket that retains an array of contacts therein. The contacts have a lower ball end in contact engagement with and supported on conductive pads of the circuit board. A BGA package having an array of solder balls is received in the positioning frame and supported on the socket with the solder balls received in flared upper ends of the contacts of the socket. A heat sink has a flat base supported on the positioning frame and secured to the substrate to establish a firm contact engagement with the package thereby securely maintaining the package and the socket in position on the substrate. The positioning frame has a chamfered section and the socket and the package each have a corresponding chamfered corner for positioning purposes.

BRIEF DESCRIPTION OF THE DRAWINGS

The present invention will be apparent to those skilled in the art by reading the following description of preferred embodiments thereof, with reference to the accompanying drawings, in which:

FIG. 2A is a cross-sectional view taken along line 2C—2C of FIG. 1;

FIG. 2B is a cross-sectional view taken along line 2B—2B of FIG. 1;

FIG. 2C is a cross-sectional view taken along line 2A—2A of FIG. 1;

FIG. 2D is a partial enlarged view of FIG. 2B;

DETAILED DESCRIPTION OF THE PREFERRED EMBODIMENTS

Figure 1:
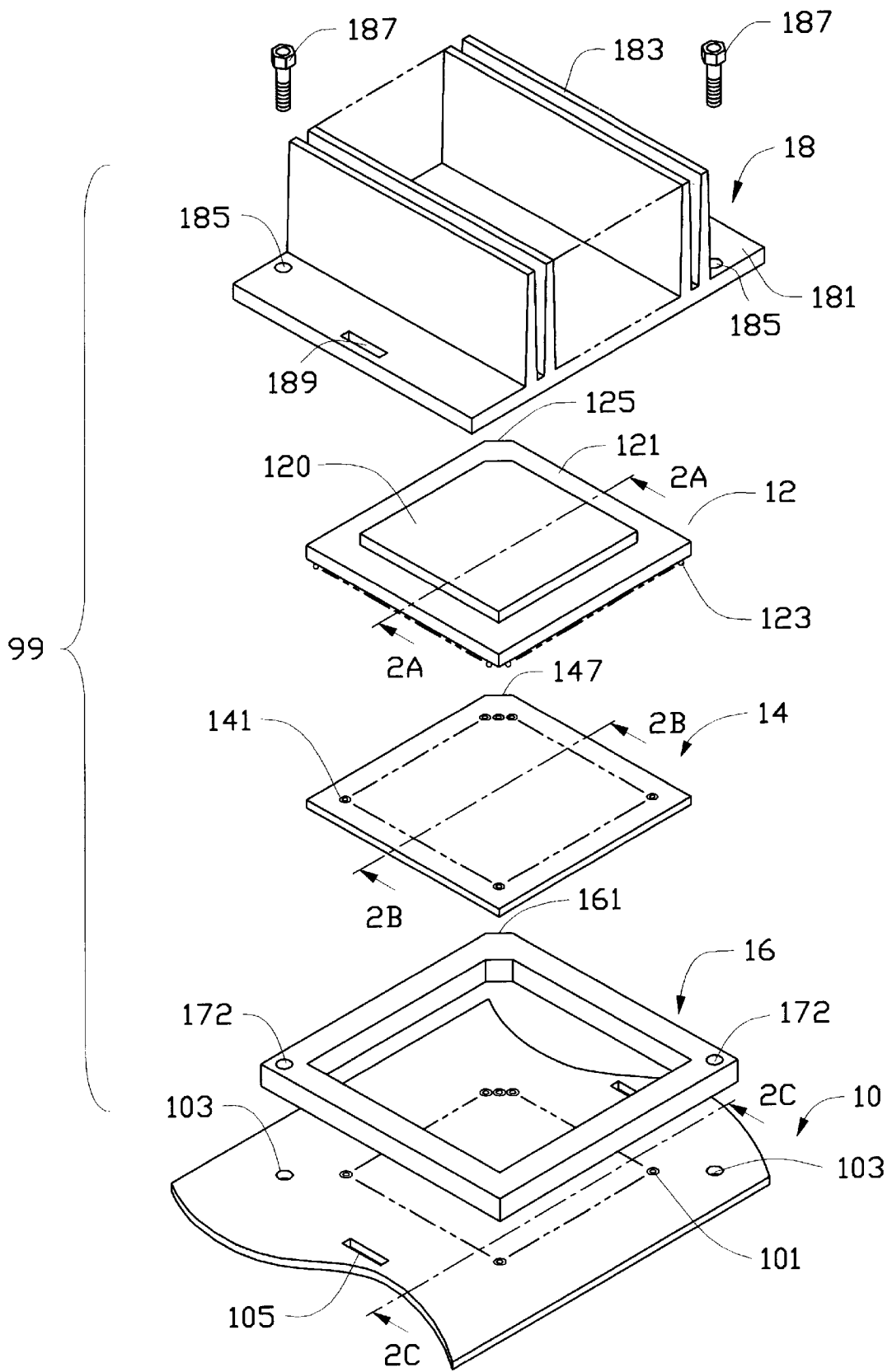
FIG. 1 is an exploded view of a package socket system in accordance with a first embodiment of the present invention for mounting a BGA package to a substrate.

Referring to the drawings and in particular to FIG. 1, wherein a package socket system in accordance with a first embodiment of the present invention, generally designated by reference numeral 99, is shown, the package socket system 99 positions and mounts a BGA package 12, such as a central processing unit, to a substrate 10. The BGA package 12 comprises a semiconductor device 120 mounted on a flat base 121 and an array of solder balls 123 formed on a bottom surface of the flat base 121, as shown in FIG. 2C. The flat base 121 has a chamfered corner 125 for positioning purposes.

Figure 3:
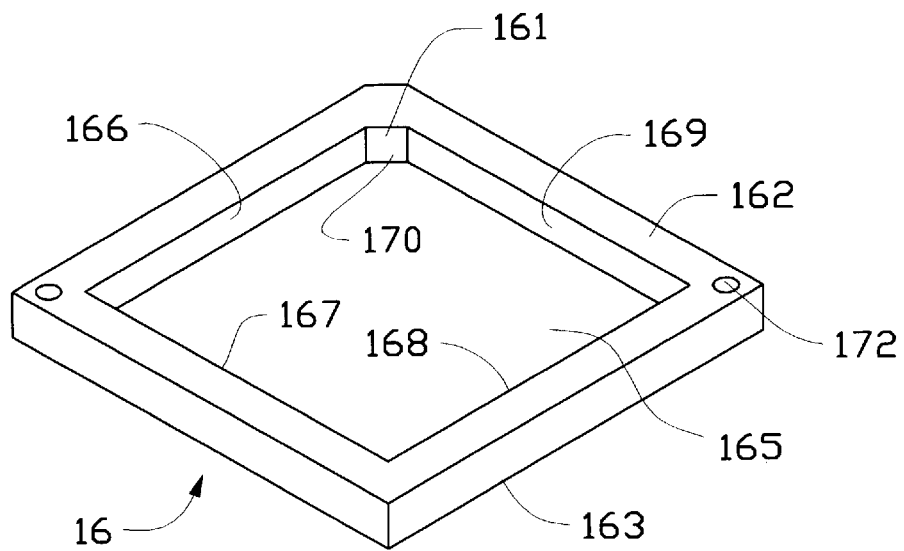
FIG. 3 is a perspective view of a positioning frame of the package socket system of the present invention.
Figure 4:
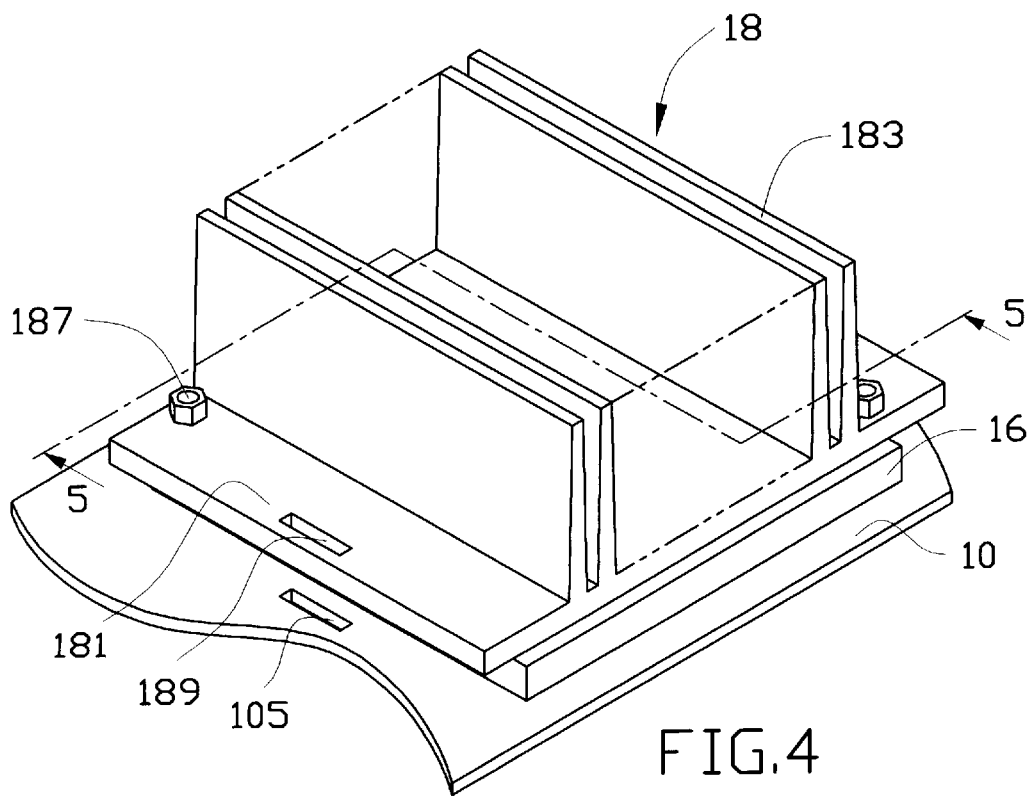
FIG. 4 is an assembled view of FIG. 1.
Figure 5:
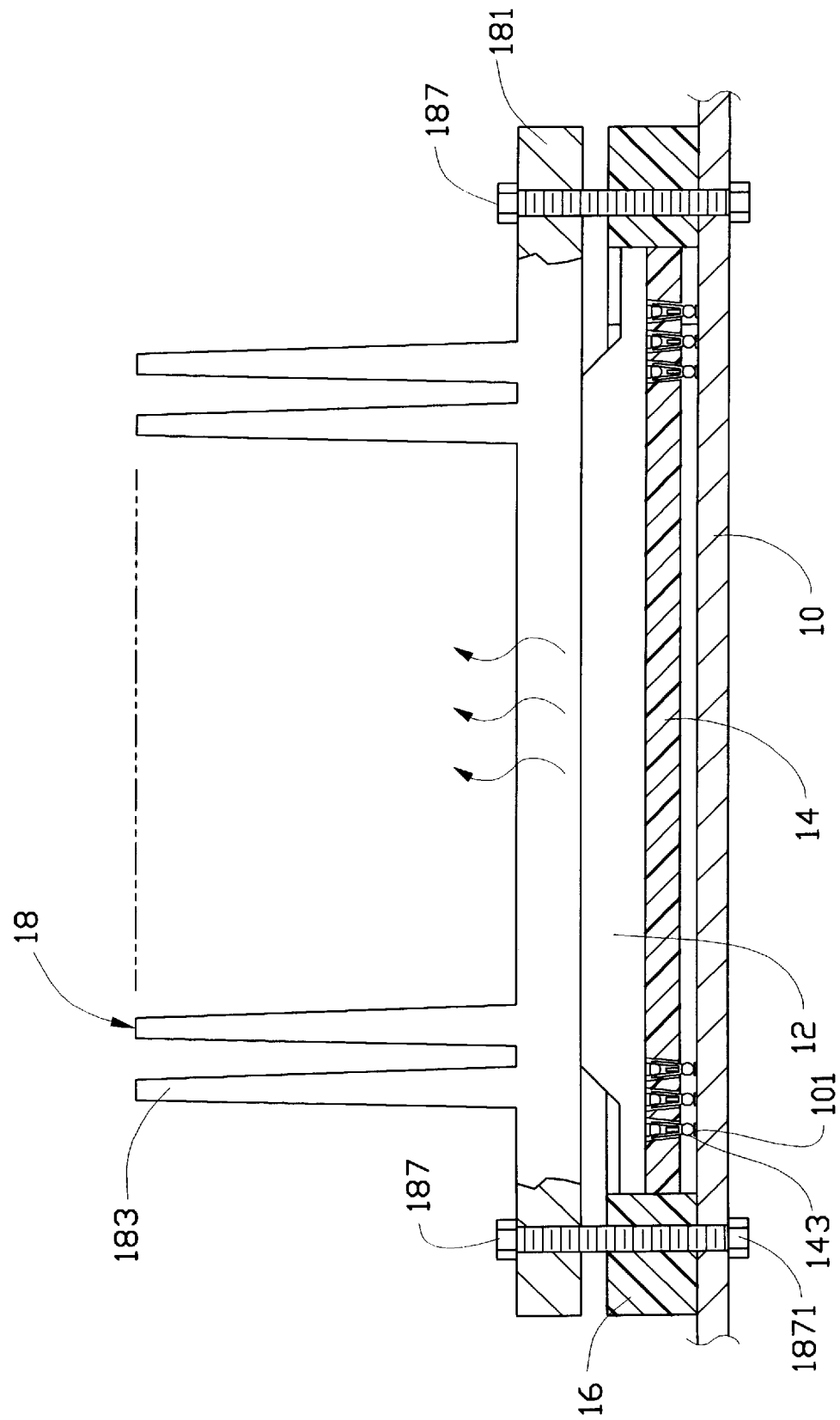
FIG. 5 is a cross-sectional view of the package socket system taken along line 5—5 of FIG. 4.

The package socket system 99 comprises a positioning frame 16 positioned on the substrate 10, as shown in FIGS. 4 and 5. Also referring to FIG. 3, the positioning frame 16 comprises a top face 162 and a bottom face 163 opposite the top face 162 and positioned on the substrate 10. An interior space 165 is defined in the positioning frame 16, and is bound by a first inside surface 166, a second inside surface 167, a third inside surface 168 and a fourth inside surface 169. The positioning frame 16 has a chamfered section 161 forming an inclined inside surface 170 between the first and fourth inside surfaces 166, 169. The chamfered section 161 of the positioning frame 16 corresponds to the chamfered corner 125 of the package 12.

A BGA socket 14 is received in the interior space 165 of the positioning frame 16, as shown in FIG. 5, whereby the socket 14 is supported on the substrate 10. The package 12 is received in the positioning frame 16, positioned on the socket 14, and retained in position by a heat sink 18 positioned on the top face 162 of the positioning frame 16, as shown in FIGS. 4 and 5.

Referring to FIGS. 2B and 2D, the socket 14 defines an array of apertures 141 therein. The apertures 141 correspond to the solder balls 123 of the package 12. The apertures 141 are tapered from a face proximate the package 12 to a face proximate the substrate 10. A contact 143 is received in each of the apertures 141. Each contact 143 has a flared open end 146 for partially receiving and retaining the corresponding solder ball 123 of the package 12, thereby forming an electrical engagement therebetween, as shown in FIG. 5. The contact 143 also has a ball end 145 extending beyond a bottom surface of the socket 14 for engaging with and being supported on conductive pads 101 (FIG. 2A) provided on the substrate 10.

Referring back to FIG. 1, the heat sink 18, which is made of highly heat conductive material, has a base plate 181 positioned on the positioning frame 16. The base plate 181 physically engages the semiconductor device 120 of the package 12 to remove heat therefrom. A plurality of fins 183 are formed on the base 181. The fins 183 are spaced from each other and allow air to flow therethrough for facilitating heat removal. The base 181 defines holes 185 therein for the extension of bolts 187 therethrough. The bolts 187 further extend through holes 172 defined in the positioning frame 16 and holes 103 defined in the substrate 10. The bolts 187 are engaged by nuts 1871 (FIG. 5) to secure the heat sink 18 and the positioning frame 16 to the substrate 10.

The positioning frame 16 has a predetermined height between the top face 162 and the bottom face 163 which promotes a firm engagement between the base 181 of the heat sink 18 and the semiconductor device 120 of the package 12 when the heat sink 18 is secured to the substrate 10. Thus, heat is properly transferred from the semiconductor device 120 to the heat sink 18, and the package 12 and the socket 14 are securely retained on the substrate 10. The interior space 165 of the positioning frame 16 provides a snug engagement between the inside faces 166, 167, 168, 169 of the positioning frame 16 and the socket 14 and the package 12 thereby hindering lateral movement or displacement of the socket 14 and the package 12 with respect to the substrate 10. The socket 14 is provided with a chamfered corner 147 corresponding to the inclined face 170 of the positioning frame 16 for positioning purposes.

Figure 6:
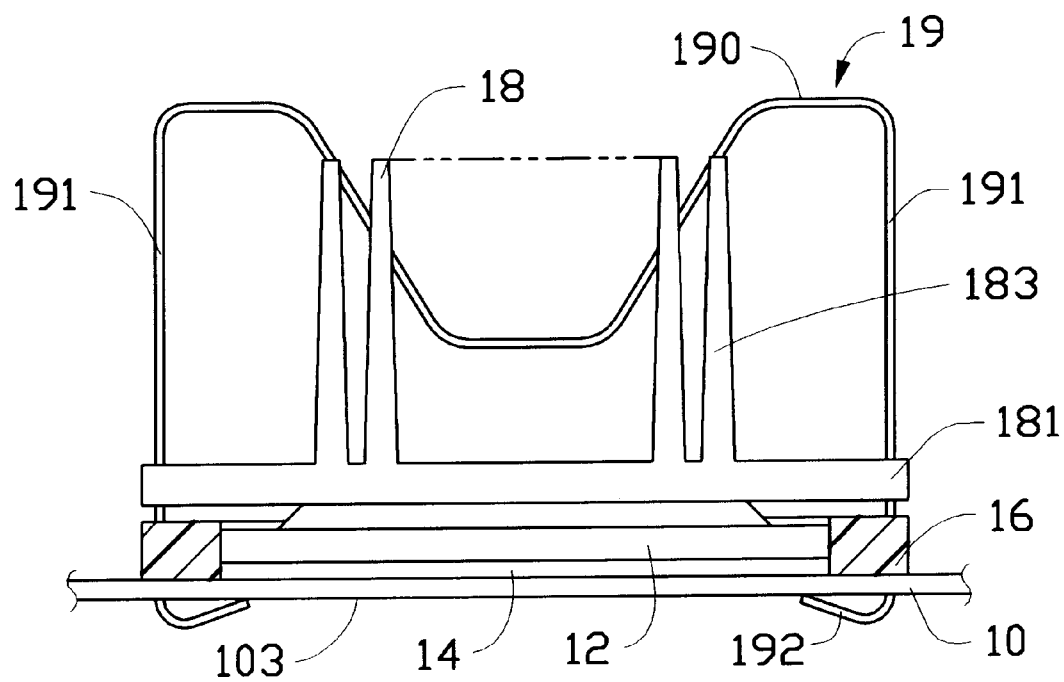
FIG. 6 is a cross-sectional view of a second embodiment of the package socket system in accordance with the present invention.

FIG. 6 shows a second embodiment of the present invention, wherein a clip 19 replaces the bolts 187 of the first embodiment to secure the heat sink 18 and the positioning frame 16 to the substrate 10. The clip 19 has an arced top section 190 which is elastically deformable and in contact engagement with the heat sink 18. Two legs 191 downwardly extend from the top section 190 through slots 189 defined in the base plate 181 of the heat sink 18 and slots 105 defined in the substrate 10 (FIGS. 1 and 4). Each leg 191 has a bent end 192 engaging a bottom surface 103 of the substrate 10 thereby securing the heat sink 18 and the positioning frame 16 to the substrate 10.

Although the present invention has been described with reference to preferred embodiments thereof, it is apparent to those skilled in the art that a variety of modifications and changes may be made without departing from the scope of the present invention which is intended to be defined by the appended claims.

What is claimed is:

1. A package socket system adapted to mount an electronic package having solder balls to a substrate, comprising:

a positioning frame having a top face and a bottom face positioned on the substrate, and defining an interior space therein;

a socket snugly received in the interior space of the positioning frame, the socket defining an array of apertures, each aperture receiving a contact therein, each contact having a lower end extending beyond a bottom face of the socket and adapted to be electrically engaged with and supported on a corresponding conductor formed on the substrate, the socket having a top face on which the package is positioned with the solder balls thereof received in the apertures in contact engagement with the contacts;

a highly heat conductive retaining member being adapted to be positioned above the package and being placed on the positioning frame; and means for securing the retaining member and the positioning frame to the substrate;

wherein the interior space of the positioning frame snugly receives the package placed above the socket, and the positioning frame has a predetermined height between the top and bottom faces thereof to facilitate a firm contacting engagement between the retaining member and the package, thereby securely maintaining the package and the socket in position on the substrate.

2. The package socket system as claimed in claim 1, wherein the retaining member forms a plurality of fins thereon to serve as a heat sink.

3. The package socket system as claimed in claim 1, wherein the retaining member defines a plurality of first holes for the extension of bolts therethrough, the bolts engaging with corresponding nuts to secure the retaining member to the substrate.

4. The package socket system as claimed in claim 3, wherein the bolts extend through corresponding second holes defined in the positioning frame.

5. The package socket system as claimed in claim 1, wherein the retaining member defines two slots therein, a clip having an elastically deformable top section being positioned on and in contact engagement with the retaining member, two legs downwardly extending from the clip and through the slots to engage corresponding openings defined in the substrate thereby securing the retaining member to the substrate.

6. The package socket system as claimed in claim 1, wherein the positioning frame has a chamfered section defining an inclined face between two adjacent inside faces thereof, the socket having a chamfered corner corresponding to the chamfered section of the positioning frame.

7. The package socket system as claimed in claim 1, wherein the lower end of each contact of the socket comprises a ball.

8. The package socket system as claimed in claim 1, wherein the contacts have a flared upper end for receiving and being in contact engagement with the corresponding solder ball of the package.

9. A package socket system comprising:

a positioning frame defining an interior space;

a socket snugly restrainedly received within the interior space, said socket including a plurality of contacts arranged in a matrix, each of said contacts defining an upper end and a lower end;

an electronic package snugly restrainedly received within the interior space and directly seated upon the socket, said package including a plurality of solder balls mechanically and electrically connected to the corresponding contacts, respectively;

a heat sink positioned atop the package;

a printed circuit board positioned below said positioned frame and said socket; and means for vertically fastening the heat sink, the frame and the printed circuit board together.

\* \* \* \* \*